(12) United States Patent
Yamazaki et al.

(10) Patent No.: US 7,214,574 B2
(45) Date of Patent: May 8, 2007

(54) HEATING TREATMENT DEVICE, HEATING TREATMENT METHOD AND FABRICATION METHOD OF SEMICONDUCTOR DEVICE

(75) Inventors: Shunpei Yamazaki, Tokyo (JP); Hisashi Ohtani, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 10/141,206

(22) Filed: May 7, 2002

(65) Prior Publication Data

US 2002/0127830 A1    Sep. 12, 2002

Related U.S. Application Data

(62) Division of application No. 09/038,640, filed on Mar. 10, 1998, now Pat. No. 6,423,585.

(30) Foreign Application Priority Data

Mar. 11, 1997 (JP) ................. 9-074425
Apr. 19, 1997 (JP) ................. 9-115274

(51) Int. Cl.
*H01L 21/324* (2006.01)
*H01L 21/336* (2006.01)
*H01L 21/84* (2006.01)

(52) U.S. Cl. ............ 438/166; 438/487; 438/795; 438/928; 117/8; 117/10; 117/219; 117/222

(58) Field of Classification Search ......... 438/166, 438/487, 486, 795, 928; 117/8, 10, 219, 117/222; 250/341.1, 341.4, 341.7, 494.1, 250/495.1

See application file for complete search history.

(56) References Cited

U.S. PATENT DOCUMENTS 4,001,047 A * 1/1977 Boah (Continued)

FOREIGN PATENT DOCUMENTS

EP    0 124 261    9/1987

(Continued)

OTHER PUBLICATIONS

Kiichi Hirano et al., "Low temperature activation method of poly-Si films using rapid thermal annealing," Proceedings of SPIE, vol. 3014, *Active Matrix Liquid Crystal Display Technology and Applications*, Tolis Voutsas, Tsu-Jae king eds., pp. 119-126, Mar. 1997.

*Primary Examiner*—M. Wilczewski
(74) *Attorney, Agent, or Firm*—Fish & Richardson P.C.

(57) ABSTRACT

To provide a method and a device for subjecting a film to be treated to a heating treatment effectively by a lamp annealing process, ultraviolet light is irradiated from the upper face side of a substrate where the film to be treated is formed and infrared light is irradiated from the lower face side by which the lamp annealing process is carried out. According to such a constitution, the efficiency of exciting the film to be treated is significantly promoted since electron excitation effect by the ultraviolet light irradiation is added to vibrational excitation effect by the infrared light irradiation and strain energy caused in the film to be treated by the lamp annealing process is removed or reduced by a furnace annealing process.

90 Claims, 8 Drawing Sheets

U.S. PATENT DOCUMENTS

| | | | |
|---|---|---|---|
| 4,151,008 A * | 4/1979 | Kirkpatrick | |
| 4,482,395 A * | 11/1984 | Hiramoto | |
| 4,571,486 A * | 2/1986 | Arai et al. | 219/354 |
| 4,643,527 A * | 2/1987 | Magarino et al. | 350/333 |
| 4,659,422 A | 4/1987 | Sakurai | |
| 4,888,302 A | 12/1989 | Ramesh | |
| 5,219,786 A * | 6/1993 | Noguchi | |
| 5,278,093 A * | 1/1994 | Yonehara | 438/166 |
| 5,357,365 A * | 10/1994 | Ipposhi et al. | 359/205 |
| 5,534,709 A * | 7/1996 | Yoshimoto et al. | 250/588 |
| 5,583,663 A * | 12/1996 | Boeve | 358/487 |
| 5,612,251 A * | 3/1997 | Lee | |
| 5,624,851 A * | 4/1997 | Takayama et al. | 438/166 |
| 5,643,826 A | 7/1997 | Ohtani, et al. | |
| 5,648,277 A | 7/1997 | Zhang, et al. | |
| 5,683,935 A * | 11/1997 | Miyamoto et al. | |
| 5,767,003 A * | 6/1998 | Noguchi | 438/487 |
| 5,771,110 A | 6/1998 | Hirano et al. | |
| 5,789,762 A | 8/1998 | Koyama et al. | |
| 5,811,327 A * | 9/1998 | Funai et al. | 438/166 |
| 5,817,548 A * | 10/1998 | Noguchi et al. | 438/166 |
| 5,821,135 A * | 10/1998 | Mei et al. | 438/487 |
| 5,840,118 A | 11/1998 | Yamazaki | |
| 5,854,096 A * | 12/1998 | Ohtani et al. | 438/166 |
| 5,923,962 A | 7/1999 | Ohtani, et al. | |
| 5,937,282 A | 8/1999 | Nakajima et al. | |
| 6,083,801 A * | 7/2000 | Ohtani | 438/166 |
| 6,187,616 B1 | 2/2001 | Gyoda | |
| 6,348,369 B1 * | 2/2002 | Kusumoto et al. | 438/166 |
| 6,423,585 B1 * | 7/2002 | Yamazaki et al. | 438/166 |
| 6,500,704 B1 | 12/2002 | Hirano et al. | |
| 6,528,397 B1 * | 3/2003 | Taketomi et al. | 438/166 |
| 6,569,716 B1 * | 5/2003 | Suzuki | 438/149 |
| 6,599,790 B1 * | 7/2003 | Yamazaki et al. | 438/166 |
| 6,790,714 B2 | 9/2004 | Hirano et al. | |
| 6,830,616 B1 | 12/2004 | Ohtani | |
| 2001/0020702 A1 | 9/2001 | Hirano et al. | |
| 2005/0014316 A1 | 1/2005 | Hirano et al. | |

FOREIGN PATENT DOCUMENTS

| | | |
|---|---|---|
| EP | 0 319 082 | 6/1989 |
| JP | 58-147024 | 9/1983 |
| JP | 59-205711 | 11/1984 |
| JP | 62-229924 | 10/1987 |
| JP | 62-299011 | 12/1987 |
| JP | 64-076737 | 3/1989 |
| JP | 01-200615 | 8/1989 |
| JP | 03-266424 | 11/1991 |
| JP | 04-298020 | 10/1992 |
| JP | 07-130652 | 5/1995 |
| JP | 07-135318 | 5/1995 |
| JP | 08-051077 | 2/1996 |
| JP | 08-172050 | 7/1996 |
| JP | 08-293466 | 11/1996 |
| JP | 09-045931 | 2/1997 |
| JP | 09-051100 | 2/1997 |

\* cited by examiner

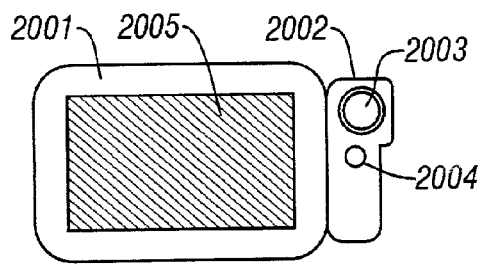
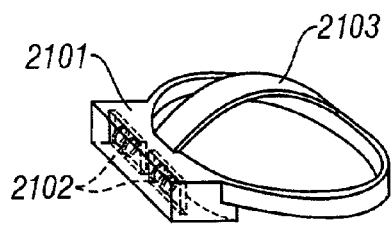
FIG. 10A  FIG. 10B
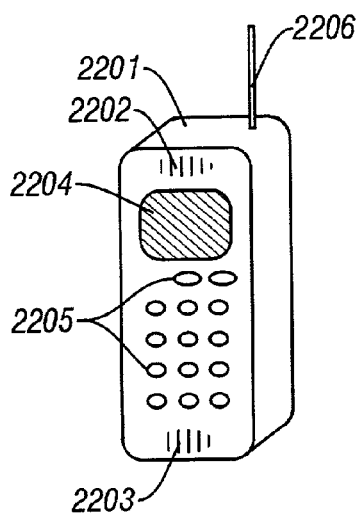
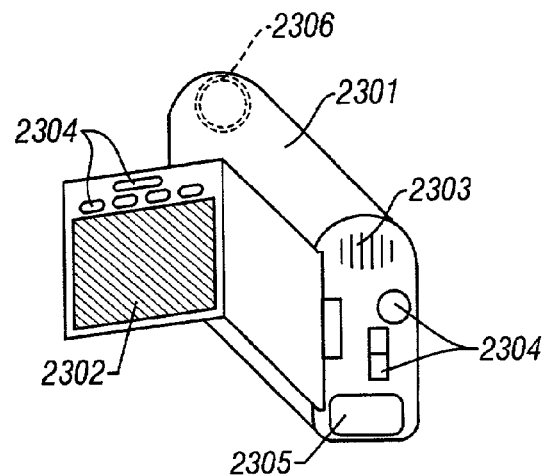
FIG. 10C  FIG. 10D
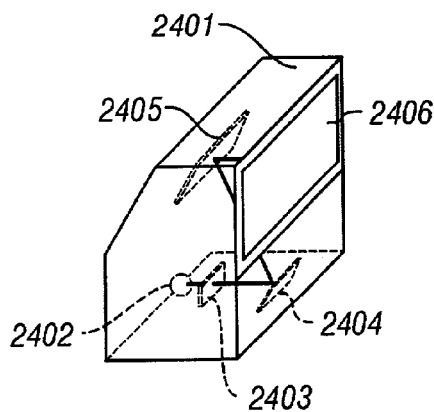
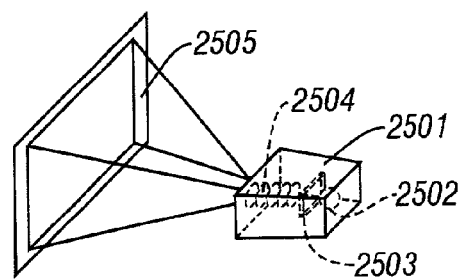
FIG. 10E  FIG. 10F

HEATING TREATMENT DEVICE, HEATING TREATMENT METHOD AND FABRICATION METHOD OF SEMICONDUCTOR DEVICE

This application is a divisional of U.S. application Ser. No. 09/038,640, filed Mar. 10, 1998.

BACKGROUND OF THE INVENTION

1. Field of the Invention

The present invention relates to a constitution in the case where lamp annealing is utilized as a heating treatment method frequently used in a fabrication process of a semiconductor device. Particularly, the present invention is effective in fabricating a semiconductor device such as a thin film transistor (TFT) on a glass substrate.

2. Description of Related Art

In recent years, development of TFT formed by utilizing a semiconductor thin film (typically thin film whose major component is silicon) on a glass substrate has significantly been progressed. Further, demand of an electrooptical device in which a pixel matrix circuit, a driver circuit, a logic circuit and the like are monolithically mounted on a glass substrate has been promoted.

The most significant restriction caused in forming TFT on a glass substrate is temperature of process. That is, a restriction whereby a heating treatment cannot be carried out at a heat resistant temperature of glass or higher narrows the margin of process.

Therefore, laser annealing process has been utilized as a means for annealing selectively a thin film. According to the laser annealing process, only a thin film can selectively be heated by elevating instantaneously temperature of a sample by irradiating a pulse laser beam onto the sample. However, there has been posed a problem in view of mass production steps in which an optical system is complicated to deal with a laser beam and the uniformity is difficult to ensure.

Hence, a lamp annealing process using a strong beam emitted from an arc lamp, a halogen lamp or the like has recently been spotlighted. This technology is referred to as RTA (Rapid Thermal Annealing) or RTP (Rapid Thermal Processing) in which a film to be treated is heated by irradiating a strong beam in a region of wavelength that is apt to be absorbed by the film to be treated.

Normally, the lamp annealing process utilizes a region of visible light to infrared light as strong beam. The light in this wavelength region is difficult to absorb by a glass substrate and accordingly, the heating of the glass substrate can be restrained to a minimum. Further, time periods for temperature rise and temperature drop are extremely short and accordingly, high temperature treatment at 1000° C. or higher can be carried out in a short period of time of several seconds to several tens seconds.

Further, a complicated optical system such as used in a fabrication process by using a laser beam is not needed and therefore, the process is suitable for treating a comparatively large area with excellent uniformity. Also, the yield and throughput are promoted since the high temperature treatment is basically carried out by a sheet by sheet process.

It is a problem of the present invention to improve the above-described lamp annealing process and to provide a method for effectively subjecting a film to be treated to a heating treatment.

Further, according to the conventional lamp annealing process, light has been irradiated only from an upper face side of a film to be treated and therefore, when a layer which does not transmit the light (for example, electrode made of a metal) or a layer which hinders irradiation of light is present at a portion or a total face of the film to be treated, the film to be treated beneath the layer could not be annealed.

Particularly, when the conventional lamp annealing process was used in a step of activating impurities doped in a semiconductor thin film, an electrode made of a metal and an insulating film which were laminated on the semiconductor thin film hindered irradiation of light and source/drain regions excellent in uniformity could not be formed.

It is one of the problems of the present invention to provide a semiconductor thin film having source/drain regions excellent in uniformity by activating impurities through a step using a heating treatment method improving the conventional lamp annealing process in a semiconductor thin film doped with impurities and by heat treatment at later steps.

SUMMARY OF THE INVENTION

According to a first aspect of the present invention disclosed in the specification, there is provided a heating treatment method which is a method of subjecting a thin film formed on a substrate having a light transmitting performance to a heating treatment by using a lamp light source, wherein a strong light in a wavelength region capable of subjecting bonds of atoms constituting the thin film to an electron excitation is irradiated from an upper face side of the thin film and simultaneously therewith a strong light in a wavelength region capable of subjecting the bonds to a vibrational excitation is irradiated from a lower face side of the thin film.

In the first aspect of the present invention, the strong light in the wavelength region capable of subjecting the bonds to the electron excitation is a light included in a wavelength region of 10 through 600 nm; and the strong light in the wavelength region capable of subjecting the bonds to the vibrational excitation is a light included in a wavelength region of 500 nm through 20 μm.

In the first aspect of the present invention, the strong light in the wavelength region capable of subjecting the bonds to the electron excitation is an ultraviolet light, and the strong light in the wavelength region capable of subjecting the bonds to the vibrational excitation is an infrared light.

Further, according to a second aspect of the present invention, there is provided a heating treatment method which is a method of subjecting a thin film formed on a substrate having a light transmitting performance to a heating treatment by using a lamp light source, wherein a strong light in a wavelength region capable of subjecting bonds of atoms constituting the thin film to an electron excitation is irradiated from an upper face side of the thin film and simultaneously therewith a strong light in a wavelength region capable of subjecting the bonds to a vibrational excitation is irradiated from a lower face side of the thin film, and wherein the strong light in the wavelength region capable of subjecting the bonds to the electron excitation and the strong light in the wavelength region capable of subjecting the bonds to the vibrational excitation are scanned from one end to other end of the substrate in a state of being fabricated in a linear shape.

According to a third aspect of the present invention, there is provided a heating treatment method which is a method of subjecting a thin film formed on a substrate having a light transmitting performance to a heating treatment by using a lamp light source:

wherein a strong light in a wavelength region capable of subjecting bonds of atoms constituting the thin film to an electron excitation and a strong light in a wavelength capable of subjecting the bonds to the vibrational excitation are irradiated from an upper face side of the thin film and simultaneously therewith a strong light in the wavelength capable of subjecting the bonds to the vibrational excitation is irradiated from a lower face side of the thin film; and wherein the strong light in the wavelength region capable of subjecting the bonds to the electron excitation and strong lights in the wavelength region capable of subjecting the bonds to the vibrational excitation are scanned from one end to other end of the substrate in a state of being fabricated in a linear shape.

In the third aspect of the present invention, an infrared light irradiated from the upper face side of the thin film is irradiated to regions of the thin film immediately before and/or immediately after a region of the thin film where an ultraviolet light is irradiated.

In the second aspect or the third aspect of the present invention, all of the strong light in the wavelength region capable of subjecting the bonds to the electron excitation and the strong lights in the wavelength region capable of subjecting the bonds to the vibrational excitation are scanned in a state of irradiating a same portion of the thin film.

In the second aspect or the third aspect of the present invention, a first region where the strong lights in the wavelength region capable of subjecting the bonds to the vibrational excitation are irradiated includes a second region where the strong light in the wavelength region capable of subjecting the bonds to the electron excitation is irradiated and is wider than the second region.

In the above-described aspects, the strong light in the wavelength region capable of subjecting the bonds to the electron excitation is a light included in a wavelength region of 10 through 600 nm, and the strong light in the wavelength region capable of subjecting the bonds to the vibrational excitation is a light included in a wavelength region of 500 nm through 20 µm.

In the above-described aspects, the strong light in the wavelength region capable of subjecting the bonds to the electron excitation is an ultraviolet light, and the strong light in the wavelength region capable of subjecting the bonds to the vibrational excitation is an infrared light.

Further, according to a fourth aspect of the present invention, there is provided a heating treatment method which is a method of subjecting a thin film formed on a substrate having a light transmitting performance to a heating treatment by using a lamp light source, said method comprising the steps of, subjecting bonds of atoms constituting the thin film to an electron excitation by irradiating an ultraviolet light from an upper face side of the thin film, subjecting the bonds to a vibrational excitation by irradiating an infrared light from a lower face side of the thin film, and wherein the step of subjecting the thin film to the electron excitation and the step of subjecting the thin film to the vibrational excitation are carried out simultaneously.

Additionally, in carrying out the present invention comprising the above-described aspects, there is needed a heating treatment device comprising at least, an ultraviolet light lamp arranged on an upper face side of a substrate to be treated, an infrared light lamp arranged on a lower face side of the substrate to be treated, and wherein the ultraviolet light lamp and the infrared light lamp are arranged to interpose the substrate to be treated.

Further, in carrying out the above-described aspects of the present invention, there is needed a heating treatment device comprising at least, an ultraviolet light lamp and an infrared light lamp arranged on an upper face side of a substrate to be treated;

an infrared light lamp arranged on a lower face side of the substrate to be treated, and wherein the ultraviolet light lamp and the infrared light lamps are arranged to interpose the substrate to be treated.

In the above-described aspects of the heating treatment device, the infrared light lamp arranged on the upper face side of the substrate to be treated is an auxiliary lamp for irradiating a region different from a region irradiated by the ultraviolet light lamp.

Further, according to the inventors, the most preferable constitution of the present invention is a constitution where infrared light and ultraviolet light are fabricated in a linear shape and irradiated. In that case, a heating treatment device in which an ultraviolet light lamp and an infrared light lamp are in a rod-like shape or a cylindrical shape having a longitudinal direction in a direction in parallel with a substrate to be treated may be used. Further, it is effective to also arrange cylindrical lenses between the ultraviolet light lamp and the substrate to be treated and between the infrared light lamp and the substrate to be treated.

Further, according to a fifth aspect of the present invention, there is provided a method of fabricating a semiconductor device for subjecting a semiconductor thin film formed on a substrate having a light transmitting performance to a heating treatment by irradiating a strong light, said method comprising the steps of, irradiating strong beams emitted from at least one lamp light source provided on an upper face side of the semiconductor thin film and at least one lamp light source provided on a lower face side of the semiconductor thin film to the semiconductor thin film, and carrying out a heat treatment on the semiconductor thin film after the step of irradiating the strong beams.

According to a sixth aspect of the present invention, there is provided a method of fabricating a semiconductor device for irradiating a semiconductor thin film doped with impurities and subjecting the semiconductor thin film to a heating treatment thereby activating the impurities, said method comprising the steps of, irradiating strong lights emitted from at least one lamp light source provided on an upper face side of the semiconductor thin film and at least one lamp light source provided on a lower face side of the semiconductor thin film to the semiconductor thin film, and carrying out a heat treatment on the semiconductor thin film after the step of irradiating the strong beams.

In the fifth aspect or the sixth aspect of the present invention, the heat treatment is carried out by a furnace annealing process at 500 through 700° C.

In the fifth aspect or the sixth aspect of the present invention, strain energy of the semiconductor thin film is reduced by the heat treatment.

In the fifth aspect or the sixth aspect of the present invention, the strong lights are scanned from one end to other end of the substrate in a state of being fabricated in a linear shape.

In the fifth aspect or the sixth aspect of the present invention, all of the strong lights are scanned in a state of irradiating a same portion of the thin film.

In the fifth aspect or the sixth aspect of the present invention, the strong light from the upper face side is a light whose major component is in a wavelength region capable of subjecting bonds of atoms of the semiconductor thin film to an electron excitation, and the strong beam from the lower face side is a light whose major component is in a wavelength region capable of subjecting the bonds of the atoms of the semiconductor thin film to a vibrational excitation.

Further, in the above-described aspects of the present invention, the strong light in the wavelength region capable of subjecting the bonds of the atoms of the semiconductor thin film to the electron excitation is an ultraviolet light, and the strong light in the wavelength region capable of subjecting the bonds of the atoms of the thin film to the vibrational excitation is an infrared light.

Further, in the above-described aspects of the present invention, the wavelength region capable of subjecting the bonds of the atoms of the semiconductor thin film to the electron excitation falls in a range of 10 through 600 nm, and the wavelength region capable of subjecting the bonds of the atoms of the thin film to the vibrational excitation falls in a range of 500 nm through 20 µm.

BRIEF DESCRIPTION OF THE DRAWINGS

FIGS. 10A, 10B, 10C, 10D, 10E and 10F are views showing semiconductor devices as applied products.

DETAILED DESCRIPTION OF THE PREFERRED EMBODIMENTS

Figure 1A:
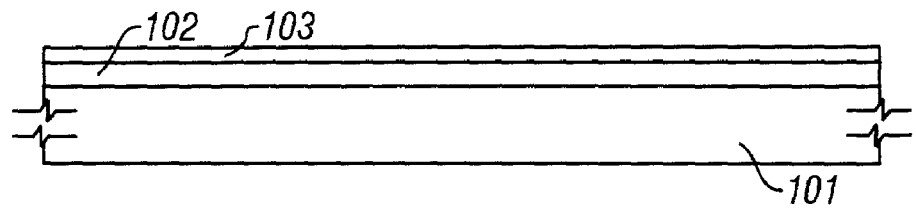
FIGS. 1A, 1B and 1C are views showing a constitution of a heating treatment according to the present invention.

One feature of the present invention resides in irradiating a combination of ultraviolet light (UV light) and infrared light (IR light) to a film to be treated.

Further, another feature of the present invention resides in a semiconductor device and a fabrication method of a semiconductor device using a semiconductor thin film provided by a device of irradiating light from both face sides to a film to be treated, particularly irradiating a combination of ultraviolet light (UV light) and infrared light (IR light) from an upper face side and a lower face side thereof.

Incidentally, although ultraviolet light has been described as representative light providing photon energy, visible light can be included so far as it is a light in a wavelength region capable of subjecting a film to be treated to electron excitation. Representatively, light in a wavelength region of 10 through 600 nm can be used.

Further, similarly, although infrared light has been described as representative light providing vibrational energy (may be referred to as thermal energy), visible light can also be included so far as it is a light in a wavelength region capable of subjecting a film to be treated to vibrational excitation. Representatively, light in a wavelength region of 500 nm through 20 µm can be used.

Further, although the above-described wavelength regions overlap in a visible light region of 500 through 600 nm, this is because a wavelength region capable of subjecting a film to be treated to electron excitation or vibrational excitation differs depending on the film to be treated. That is, this does not signify that electron excitation and vibrational excitation are simultaneously caused by light in the same wavelength region.

The above-described ultraviolet light can be obtained with lamps emitting ultraviolet ray such as a low pressure metal vapor lamp, a low pressure mercury lamp, a medium pressure mercury lamp, a high pressure mercury lamp, a halogen arc lamp, a hydrogen arc lamp, a metal halide lamp, a heavy hydrogen lamp, a rare gas resonance line lamp, a rare gas molecular light emitting lamp and the like as light sources.

Further, the above-described infrared light can be obtained with lamps emitting infrared ray such as a halogen lamp, a halogen arc lamp, a metal halide lamp and the like as light sources.

According to light irradiation treatment using ultraviolet light, energy provided to photon is given to a film to be treated in a form of light absorption and directly excites bonds of molecules constituting the film to be treated. Such an excitation phenomenon is referred to as electron excitation. Further, ultraviolet light is preferably irradiated from an upper face side of a film to be treated since the light is apt to be absorbed by a glass substrate.

Meanwhile, according to light irradiation treatment by infrared light, vibrational energy is given in a form of lattice vibration and indirectly excites bonds of molecules constituting a film to be treated as excitation energy. Such an excitation phenomenon is referred to as vibrational excitation. Further, infrared light can be irradiated from a lower face side of the film to be treated since it is difficult to be absorbed by a glass substrate.

Steps of the present invention can achieve effects explained below.

First, in addition to vibrational excitation (excitation by thermal energy) according to the conventional irradiation of infrared light, electron excitation excited by irradiation of ultraviolet light is caused and therefore, the efficiency of exciting a crystalline silicon film 103 is surprisingly promoted by a synergetic effect of these.

That is, bonds of molecules constituting the crystalline silicon film 103 are totally loosened by lattice vibration caused by irradiation of infrared light and are connected to each other in a state in which molecules are extremely active in view of electrons by irradiation of ultraviolet light. Accordingly, a crystalline silicon film 112 which has been subjected to a heating treatment according to the present invention, is formed of a very active state (state where degree of freedom of bond is high).

Therefore, in the crystalline silicon film 112 provided by carrying out the present invention, crystal defects such as unpaired bonds are very few. Further, a grain boundary is formed by a bond having excellent compatibility and therefore, almost all of the grain boundary is formed by an inert boundary such as an inclined boundary.

Further, it seems that since the basic absorption edge of silicon is substantially 1 eV, ultraviolet light is absorbed only by a surface having a thickness of about 10 nm through 1 μm. However, according to the case of embodiments of the present invention, a film thickness of a crystalline silicon film is extremely as thin as 10 through 75 nm (representatively, 15 through 45 nm) and accordingly, sufficient excitation effect can be expected.

Further, the conventional lamp annealing was a lump treatment in respect of all the faces and therefore, when the treatment time period was long, there was a concern where heat is propagated from a film to be treated to a glass substrate and the glass substrate is warped or contracted.

However, according to the present invention, a linear infrared light lamp 108 is used as the light source of an infrared light 111 and therefore, propagation heat conducted from the crystalline silicon film 103 to a substrate 101 is only local. Therefore, the substrate 101 can be prevented from being warped or contracted by heat.

Further, although in this embodiment, a heating treatment method of the present invention is applied to steps of improving the crystalline performance of a crystalline silicon film, the present invention can naturally be applied to a step of crystallizing an amorphous silicon film.

In this way, according to the present invention, the excitation effect of a film to be treated can further be promoted by irradiating ultraviolet light simultaneously with irradiation of infrared light in a heating treatment using a lamp annealing process. That is, an effect of significantly promoting the efficiency of a heating treatment is achieved.

Figure 5:
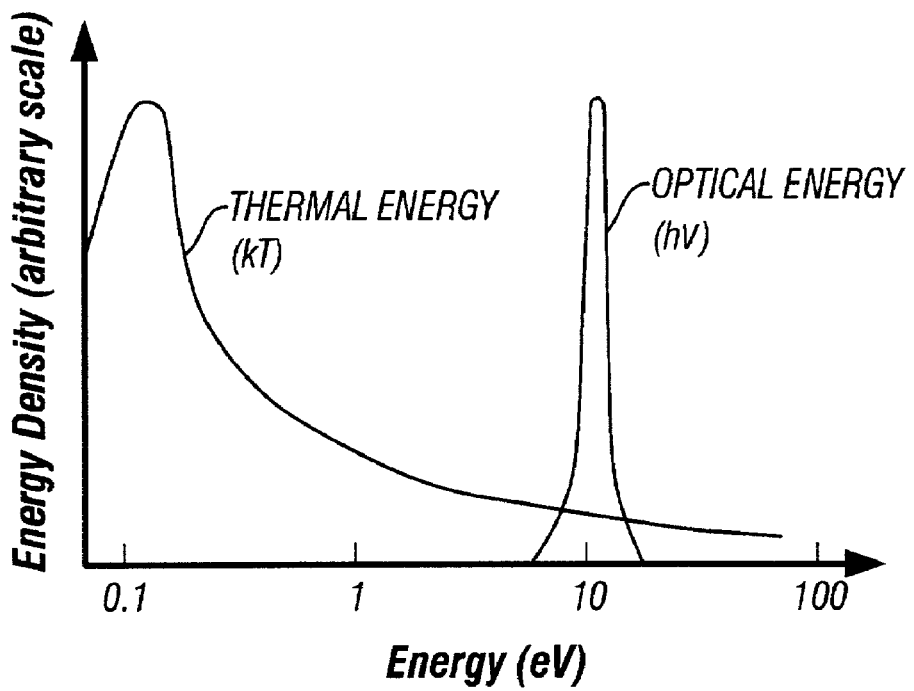
FIG. 5 is a diagram showing a difference between thermal energy and optical energy.

Meanwhile, FIG. 5 shows a conceptual diagram representing a difference between thermal energy and optical energy in which the abscissa designates energy and the ordinate designates energy density. As shown by FIG. 5, the thermal energy is provided with average energy of kT in view of energy and is provided with an energy distribution in a wide range. Meanwhile, the optical energy is provided with a certain value determined by wavelength, that is, energy of h? per se.

Accordingly, when crystals of, for example, a silicon film are grown, although the thermal energy includes also energy for destructing crystals or the like other than energy necessary for growth, the optical energy can efficiently irradiate only energy necessary for growth.

In this way, only a specific thin film can be excited concentratingly by pertinently selecting wavelength of ultraviolet light and therefore, degrees of excitation of different kinds of films to be treated can be controlled or a selective excitation treatment can be carried out. This is one of effects of the present invention where ultraviolet light irradiation is combined with lamp annealing by infrared light.

Also, the present invention is not limited to a combination of lamp annealing by infrared light and ultraviolet light irradiation but, for example, the lamp annealing from an upper face side by infrared light may be combined with lamp annealing by infrared light from a lower face side.

When a lamp annealing process according to the present invention is used in a step of growing crystals of a film whose major component is silicon, an excellent quality semiconductor thin film which is excellent in the uniformity can be provided.

Further, when a lamp annealing process of the present invention is used in a step of activating a film having silicon as a major component and doped with impurities, a source region and a drain region having excellent characteristics can be obtained.

Further, when furnace annealing is conducted after a step of using the lamp annealing process of the present invention, strain energy caused by the step of using the lamp annealing process of the present invention can be reduced or removed.

Accordingly, when the lamp annealing process of the present invention is used, it is preferable to also carry out thermal annealing at later steps.

(Embodiment 1)

Figure 1B:
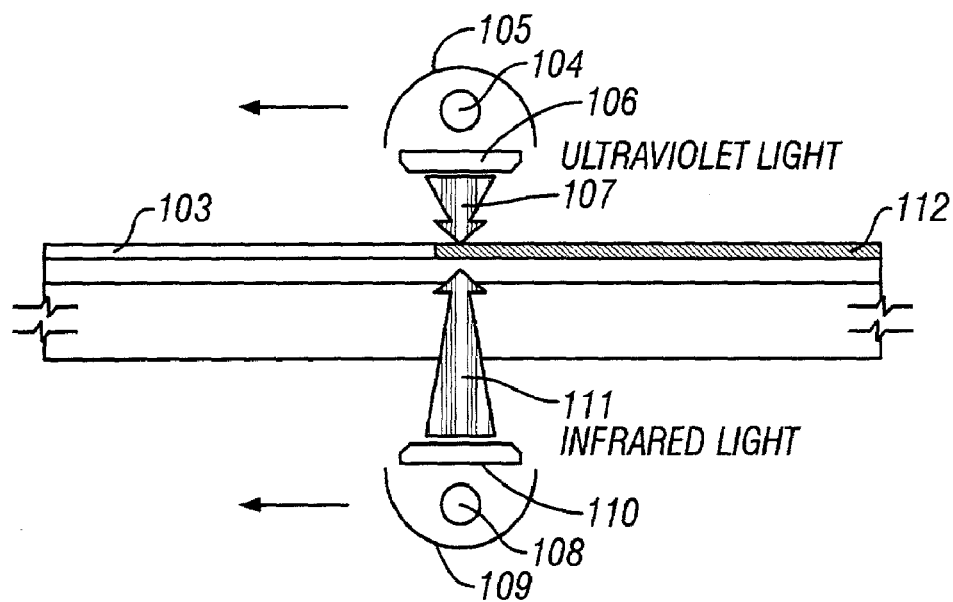
Figure 1C:
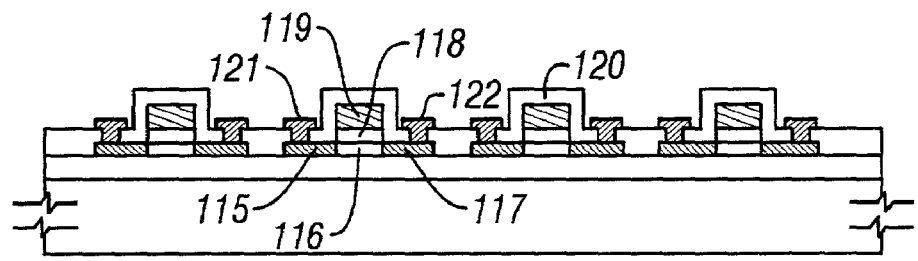

In this embodiment, an explanation will be given of a fabrication method of a semiconductor device in respect of an example of a case where the present invention is applied to a step of improving crystalline performance of a crystalline film whose major component is silicon in reference to FIGS. 1A, 1B and 1C. Incidentally, numerical values, materials, and the like are not limited to those in this embodiment.

First, an underlayer film 102 comprising a silicon oxide film having a thickness of 2000 Å is formed on a glass (or quartz) substrate 101 as a substrate having light transmitting performance. Thereafter, an amorphous silicon film having a thickness of 300 Å through 500 Å or a thickness of 500 Å in this embodiment is piled up directly on the underlayer film by a low pressure thermal CVD (Chemical Vapor Deposition) process or the like.

It is preferable to use means for crystallizing an amorphous silicon film by a heating treatment or laser beam irradiation. Also, it is effective to use means for using a catalyst element promoting crystallization (disclosed in Japanese Unexamined Patent Publication No. JP-A-7-130652). In this way, the crystalline silicon film 103 is obtained. (FIG. 1A) Incidentally, although an explanation will be given of this embodiment with an example of a crystalline silicon film for the crystalline film 103, a compound semiconductor including silicon such as $Si_xGe_{1-x}$ (0<X<1) or the like can be used.

Further, although the crystalline silicon film includes a single crystal film, a microcrystal film, a polycrystal silicon film or the like, in this embodiment, an explanation will be given with a polycrystal silicon film (so to speak polysilicon film) as an example.

Further, numeral 104 designates a lamp light source emitting ultraviolet light (ultraviolet ray) (hereinafter, simply referred to as ultraviolet light lamp), numeral 105 designates a reflecting mirror and numeral 106 designates a cylindrical lens for converging ultraviolet light 107 emitted from the ultraviolet light lamp 104. Each of the ultraviolet light lamp 104, the reflecting mirror 105 and the cylindrical lens 106 is provided with a shape that is slender in respect of a direction orthogonal to paper face and accordingly, light is irradiated to the crystalline silicon film 103 in a linear shape.

Further, in this embodiment, the ultraviolet light 107 is irradiated from an upper face side of the crystalline silicon film 103. The upper face side indicates a face on the side of a main face opposed to the ultraviolet light lamp 104 in FIG. 1, that is, the side reverse to the glass substrate 101.

Next, numeral 108 designates a lamp light source emitting infrared light (infrared ray) (hereafter, simply referred to as infrared light lamp), numeral 109 designates a reflecting mirror and numeral 110 designates a cylindrical lens for converging infrared light 111 emitted from the infrared light lamp 108. The infrared light 111 is also constituted to form a linear light similar to the ultraviolet light 107.

Further, the infrared light 111 is constituted to irradiate to the crystalline silicon film 103 from a lower face side. Here, the lower face side indicates a face opposed to the side of a rear face side opposed to the infrared light lamp 108 in FIG. 1, that is, the side of the glass substrate 101.

In this case, the infrared light 111 transmits through the glass substrate without being absorbed. That is, even when the infrared light 111 is irradiated from the lower face side, the crystalline silicon film 103 can efficiently be heated. Accordingly, the crystalline silicon film 103 is heated to 600 through 1200° C. (representatively, 700 through 850° C.) by irradiating the infrared light 111. The film face temperature of the crystalline silicon film 103 in this case can be measured (monitored) by using a pyrometer (radiation temperature gage) utilizing a thermocouple.

Further, the glass substrate 101 is supported by a susceptor (not illustrated), the linear ultraviolet light 107 is scanned in a direction of an arrow mark from the upper face side of the glass substrate 101 and the linear infrared light 111 is scanned in a direction of an arrow mark from the lower face side. In this way, a total face of the substrate can be irradiated by scanning the linear lights from one end to other end of the glass substrate 101.

Further, in this embodiment, the ultraviolet light 107 and the infrared light 111 irradiate the same portion of the crystalline silicon film 103. The same portion signifies that ranges of irradiation are located at the same position as shown by FIG. 1B. Naturally, depending on cases, the timings of scanning can intentionally be shifted from each other or the directions of scanning can be made different from each other.

An effect described below can be achieved by the constitution where the ultraviolet light irradiation and the infrared light irradiation are combined as mentioned above.

Further, electron excitation by the ultraviolet light irradiation is caused in addition to vibrational excitation (excitation by thermal energy) by the conventional infrared light irradiation and accordingly, the efficiency of exciting the crystalline silicon film 103 is surprisingly promoted by a synergetic effect of these.

That is, the bonds of molecules constituting the crystalline silicon film 103 are totally loosened by lattice vibration caused by the infrared light irradiation and are connected by constituting a state where the bonds are extremely active by the ultraviolet light irradiation. Therefore, the crystalline silicon film 112 (region designated by hatched lines in FIG. 1) which have been subjected to the heating treatment of the present invention, is formed by a very active state (state having high degree of freedom of bond).

Accordingly, the crystalline silicon film 112 obtained by carrying out the present invention is provided with very few crystal defects such as unpaired bonds. Further, the grain boundary is formed by bonds having excellent compatibility and therefore, almost all of the crystal boundary is formed by an inert boundary such as an inclined boundary.

Further, the basic absorption edge of silicon is substantially 1 eV and accordingly, it seems that ultraviolet light is absorbed only by a surface having a thickness of about 10 nm through 1 μm. However, in the case of the embodiment, the film thickness of the crystalline silicon film is extremely as thin as 10 through 75 nm (representatively, 15 through 45 nm) and therefore, sufficient excitation effect can be expected.

Further, the conventional lamp annealing process is a lump treatment in respect of all the face and therefore, when the treatment time is long, there is a concern where heat is propagated from a film to be treated to a glass substrate and the glass substrate is warped or contracted.

However, the linear infrared light lamp 108 is utilized in the present invention as the light source of the infrared light 111 and therefore, the heat of propagation conducted from the crystalline silicon film 103 to the substrate 101 is only local. Therefore, the substrate 101 can be prevented from being warped or contracted by the heat.

Further, although according to the embodiment, the heating treatment method has been applied in the step of improving the crystalline performance of the crystalline silicon film, the present invention is naturally applicable to a step of crystallizing an amorphous silicon film.

The crystalline silicon film 112 excellent in the crystalline performance has been obtained by carrying out the above-described treatment.

Next, when the above-described treatment has been finished, it is preferable to carry out furnace annealing at 500 through 700° C. (600° C. in this embodiment) for 2 through 8 hours (4 hours in this embodiment). By this heat treatment step, strain energy caused in the semiconductor film by the lamp annealing step described above can be removed or reduced.

When the strain energy remains as it is, it causes film peeling in fabrication process. Further, stress or lattice strain is caused by the strain energy and therefore, electric properties of a semiconductor device are changed. Accordingly, the above-described furnace annealing step is a step which is very effective as a post step of heat treatment accompanied by rapid phase change as in lamp annealing, laser annealing or the like.

Thereafter, the obtained crystalline silicon film is patterned by a photolithography process and separated in islands and an island-like region of a P-channel type TFT (Thin Film Transistor) or an island-like region of an N-channel type TFT is formed.

Further, an insulating film is formed by piling up a silicon oxide film having a thickness of 1500 Å through 2000 Å or a thickness of 1500 Å in this embodiment over the entire face by a plasma CVD process.

Successively, a gate wiring pattern is formed by forming an aluminum film having a thickness of 4000 Å through 6000 Å or 5000 Å in this embodiment by a sputtering process and by etching the film.

A gate insulating film 118 is formed by etching the insulating film with a gate electrode 119 as a mask.

Next, a source region 115 and a drain region 117 are formed by adding impurity ions providing one conductivity to an activation layer constituted by the intrinsic or substantially intrinsic crystalline silicon film. In this case, when an N-channel type TFT is fabricated, P (phosphor) ions or As (arsenic) ions may be utilized and when a P-channel TFT is fabricated, B (boron) ions may be utilized.

Next, a silicon oxide film, or a silicon nitride film or a film of laminated layers of these is formed as an interlayer insulating film 120. As an interlayer insulating film, a layer comprising a resin material may be formed on a silicon oxide film or a silicon nitride film.

Then, contact holes are formed and a source electrode 121 and a drain electrode 122 are formed. In this way, a thin film transistor is completed. (FIG. 1C)

Further, although the shape of the thin film transistor according to the present invention is of a planer type, the present invention is naturally applicable also to an inverse stagger type.

(Embodiment 2)

In this embodiment, an explanation will be given of an example of a case where the present invention is applied to a step of activating impurity ions for providing N type or P type which are added to an activation layer of TFT.

Figure 2A:
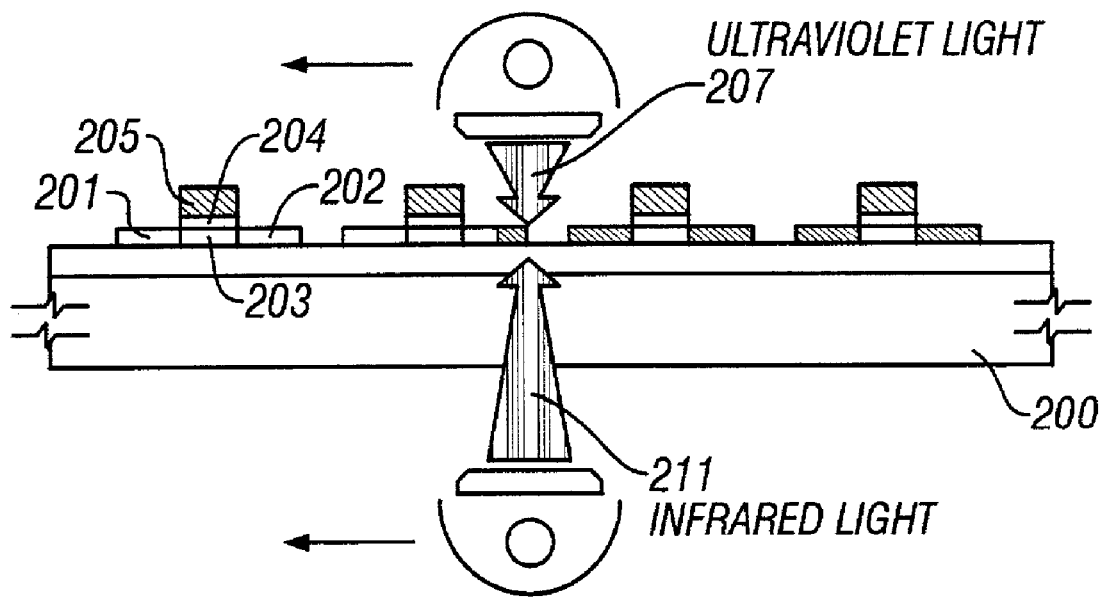
FIGS. 2A and 2B are views showing a constitution of a heating treatment according to the present invention.

A state illustrated by FIG. 2A shows a stage in the midst of fabricating TFT on a glass substrate 200. In FIG. 2A, regions designated by numerals 201 and 202 are activation layers comprising semiconductor layers which are patterned in an island-like shape, numeral 201 designates a source region, numeral 202 designates a drain region and numeral 203 designates a channel forming region.

Further, a gate insulating film 204 is formed on the above-described activation layers. The gate insulating film 204 is formed in a shape the same as that of a gate electrode 205 which is arranged on top of the gate insulating film 204 by using a technology disclosed in Japanese Unexamined Patent Publication No. JP-A-7-135318 or the like.

The source region 201 and the drain region 202 are formed by adding impurity ions providing one conductivity to an activation layer constituted by an intrinsic or substantially intrinsic crystalline silicon film. In this case, when an N-channel type TFT is fabricated, P (phosphorous) ions or As (arsenic) ions may be utilized and when a P-channel type TFT is fabricated, B (boron) ions may be utilized.

Next, when the step of adding impurity ions has been finished, ultraviolet light 207 is irradiated from an upper face side of a substrate where TFT is formed and infrared light 211 is irradiated from a lower face side of the substrate. In this case, although the ultraviolet light 207 does not reach right under the gate electrode 205, the activation process can be carried out with no problem since the infrared light 211 is irradiated from the lower face side. (FIG. 2A)

The lamp annealing process according to this embodiment is a step of activating to excite the added impurity ions. Accordingly, by applying the present invention, a rate of activation is significantly promoted and therefore, resistance of the source/drain regions is reduced and ohmic contact between TFT and a wiring electrode can be made excellent.

Further, strain energy is caused by the above-described lamp annealing process and therefore, it is preferable to remove or reduce the strain energy by carrying out furnace annealing at 500 through 700° C. or 600° C. in this embodiment for 4 hours. In this case, the annealing temperature is naturally adjusted pertinently in accordance with material of gate electrode within the above-described temperature range.

Figure 2B:
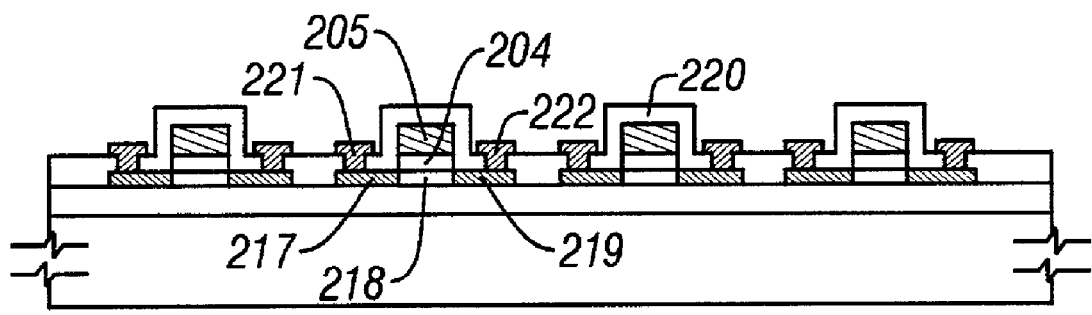

Thereafter, similar to Embodiment 1, an interlayer insulating film and contact holes are formed and source/drain electrodes and the like are formed by which a thin film transistor is completed. Naturally, when a crystalline silicon film excellent in crystalline performance that is obtained by Embodiment 1 is used, a thin film transistor having further excellent properties can be obtained. (FIG. 2B)

(Embodiment 3)

Figure 3:
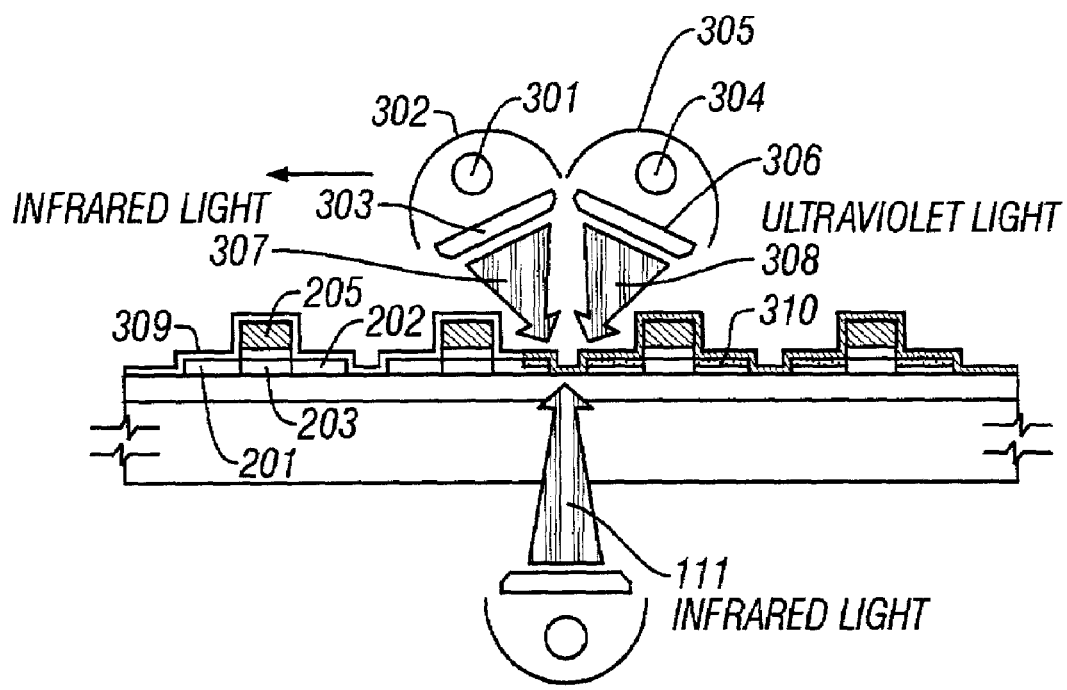
FIG. 3 is a view showing a constitution of a heating treatment according to the present invention.

In this embodiment, an explanation will be given of an example in a case where the present invention is applied to a step of forming selectively a metal silicide on a surface of source/drain regions of TFT (including a surface of a gate electrode when the gate electrode is silicon). Further, although FIG. 3 is used for the explanation, an explanation will be given by using the above-described notations as necessary.

This embodiment is featured in a constitution where infrared light and ultraviolet light are simultaneously irradiated from an upper face side of a substrate. That is, an optical system comprising an infrared light lamp 301, a reflecting mirror 302 and a cylindrical lens 303 and an optical system comprising an ultraviolet light lamp 304, a reflecting mirror 305 and a cylindrical lens 306 are arranged on the upper face side of the substrate. Further, infrared light 307 is irradiated from the infrared light lamp 301 and ultraviolet light 308 is irradiated from the ultraviolet light lamp 304.

According to this constitution, even a region constituting a shadow of the gate electrode 205 is heated by either of the infrared light 307 on the upper face and the infrared light 111 from the lower face side. Accordingly, a reaction of forming silicide can be carried out uniformly over a total of the substrate.

Further, in the case of the constitution of this embodiment, it is preferable to firstly heat the film by the infrared light 307 and excite the film by the ultraviolet light 308 immediately thereafter. That is, it seems that the efficiency of excitation is promoted when bonds are firstly loosened by vibrational excitation by the infrared light and electron excitation by the ultraviolet light is added under the state.

The step of forming a silicide that is carried out by the above-described constitution is progressed by a procedure as follows. First, when the step of activating impurity ions as described in Embodiment 2 has been finished, a metal film 309 is formed to cover a total face of TFT in the midst of fabrication. As a material of the metal film 309, Ti (titanium), Co (cobalt), W (tungsten), Ta (tantalum) or the like is generally used.

When the heating treatment is carried out under the state, silicon component constituting the source region 201 and the drain region 202 reacts with the metal film 309 by which a metal silicide 310 is formed. Such a reaction is progressed at interfaces between the source/drain regions 201 and 202 and the metal film 309 and in this embodiment, the reaction rate is increased by the excitation effect by the ultraviolet light irradiation and swift silicide formation can be realized.

Further, as a feature of the lamp annealing process, component atoms constituting the metal film 309 can be prevented from diffusing to the channel forming region 203. This effect is significant when infrared light is irradiated linearly as in the embodiment.

Incidentally, the constitution of irradiating infrared light and ultraviolet light simultaneously from the upper face side of the substrate as in the embodiment is naturally applicable to Embodiment 1 and Embodiment 2. Particularly, when the constitution is applied to Embodiment 2, the constitution is effective since portions of bonding the source/drain regions and the channel forming region and the region constituting a shadow of the gate electrode are completely activated.

Thereafter, similar to Embodiment 1, an interlayer insulating film and contact holes are formed and source/drain electrodes and the like are formed by which a thin film transistor is completed. Naturally, when the crystalline silicon film excellent in the crystalline performance obtained in Embodiment 1 and the source/drain regions and the channel region obtained in Embodiment 2 are used, a thin film transistor having further excellent properties can be provided.

(Embodiment 4)

In this embodiment, an explanation will be given of an example in a case where the present invention is applied when a step of reflowing wirings is carried out in the case where wirings (source/drain wirings) for leading out signal voltage from TFT are formed. Incidentally, although FIG. 4 is used for the explanation, the explanation will be given by using the above-described notations as necessary.

The reflow step is a technology for fluidizing a conductive film which is a wiring material by heating it and filling insides of contact holes completely with the wiring material. Contact failure can be prevented even with a contact hole having a high aspect ratio by this technology.

Figure 4:
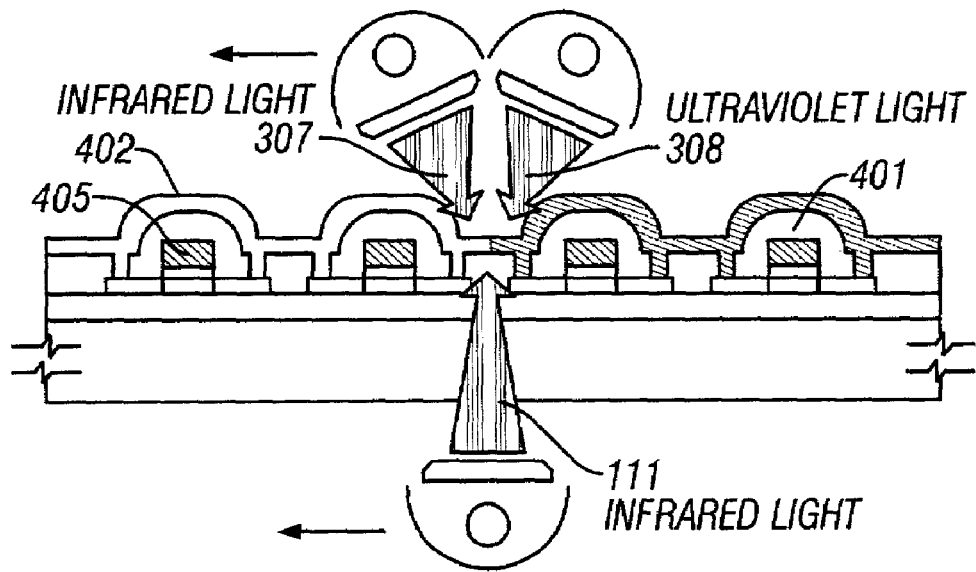
FIG. 4 is a view showing a constitution of a heating treatment according to the present invention.

In FIG. 4, numeral 401 designates an interlayer insulating film for electrically insulating and separating a gate electrode 405 from a wiring material 402. The material of the interlayer insulating film 401 may pertinently be selected from a silicon oxide film, a silicon nitride film, an organic resin material and the like. Further, the wiring material 402 may be constituted by a material including aluminum, tantalum, tungsten or the like.

Further, it is preferable in view of promoting fluidization of the wiring material in the reflow step to form a metal layer of germanium, tin, gallium, antimony or the like at an upper layer or a lower layer of the material.

The synergetic effect produced by combining ultraviolet light with infrared light can be provided also by applying the heating treatment method of the present invention to the step of reflowing the wiring material 402 as in this embodiment. Particularly, when a metal element promoting fluidization is used in the reflow step, the present invention is effective in expediting the reaction between the wiring material and the metal element.

(Embodiment 5)

This embodiment shows an example where a range of irradiating the ultraviolet light 107 and a range of irradiating the infrared light 111 differ from each other in the constitution of Embodiment 1. Especially, the range of irradiating the infrared light 111 is made wider than the range of irradiating the ultraviolet light 107. This behavior is illustrated by FIG. 6.

Figure 6:
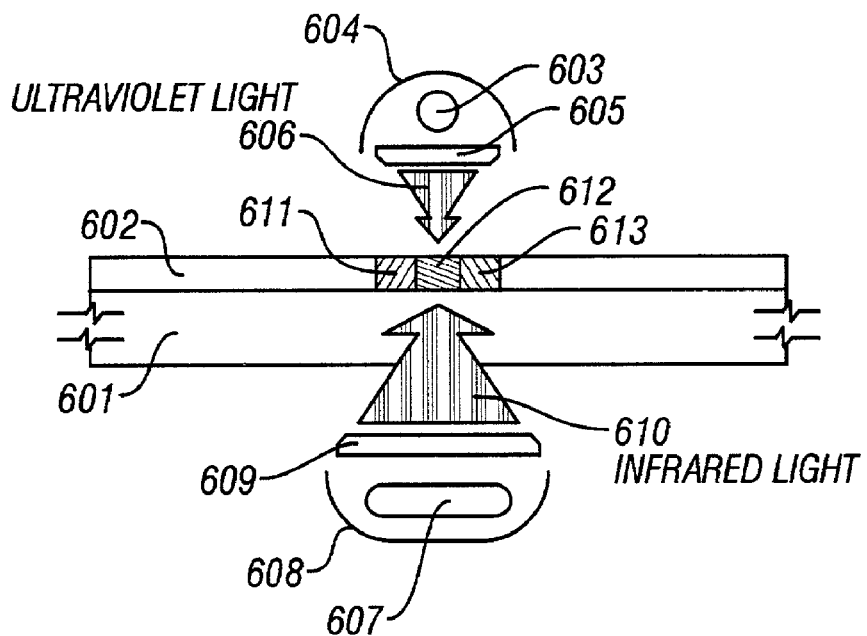
FIG. 6 is a view showing a constitution of a heating treatment according to the present invention.

In FIG. 6, numeral 601 designates a glass substrate where an underlayer film is provided on the surface and numeral 602 designates a crystalline silicon film. An ultra violet light lamp 603, a reflecting mirror 604 and a cylindrical lens 605 are arranged on an upper face side of the substrate 601 and ultraviolet light 606 is irradiated. Further, an infrared light lamp 607, a reflecting mirror 608 and a cylindrical lens 609 are arranged on the lower face side and infrared light 610 is irradiated.

In this case, the range of irradiating the infrared light 610 covers regions designated by numerals 611 through 613 (referred to as first region) and the range of irradiating the ultraviolet light 606 is only a region designated by numeral 612 (referred to as second region).

That is, the range of irradiating the infrared light 610 is designed to be wider than the range of irradiating the ultraviolet light 606. For that purpose, a length of the infrared light 610 fabricated in a linear shape in a direction of the short side is made longer than a length of the ultraviolet light 606 fabricated in a linear shape in a direction of the short side. In this way, the above-described first region includes the second region and is constituted to be wider then the second region.

Accordingly, the crystalline silicon film 602 is heated by the infrared light 610 immediately before being irradiated by the ultraviolet light 606 and is heated by the infrared light 610 for a very short time period even immediately after the ultraviolet light 606 has been irradiated. That is, a weak excitation state is produced at the region 611, a complete excitation state is produced in the region 612 and a weak excitation state is maintained in the region 613.

By the above-described constitution, a time period required for bonding can be increased since the excitation state of the crystalline silicon film 602 seems not to be changed rapidly. That is, the bonding among atoms can be prevented from being finished under a nonequilibrium state. Thereby, a crystalline silicon film having few crystal defects can be obtained.

Similar to Embodiment 1, by using the crystalline silicon film having few crystal defects which has been provided in this way, a gate electrode is formed, a gate insulating film is formed, source/drain regions are formed, an interlayer insulating film is formed, contact holes are formed and source/drain electrodes and the like are formed by which a thin film transistor is completed.

(Embodiment 6)

In this embodiment, an explanation will be given of an example of a case where infrared light auxiliary lamps are formed in parallel with an ultraviolet light lamp in the constitution of the present invention in reference to FIGS. 7A and 7B.

Figure 7A:
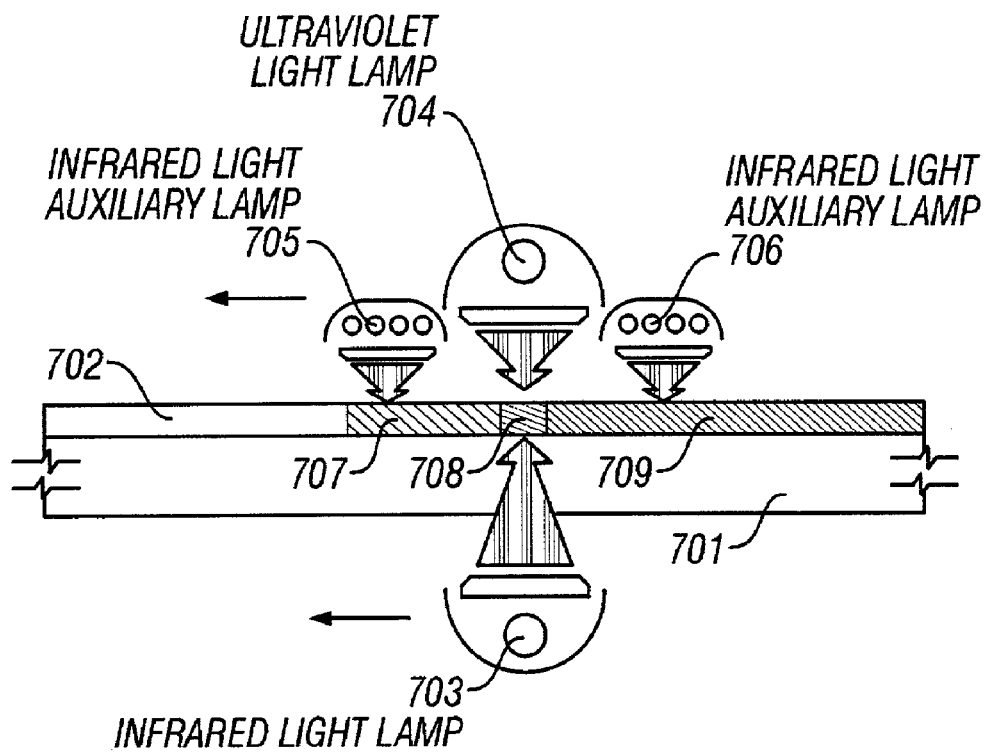
FIGS. 7A and 7B are views showing a constitution of a heating treatment according to the present invention.

In FIG. 7A, numeral 701 designates a glass substrate and numeral 702 designates an amorphous silicon film. Incidentally, although the amorphous silicon film is exemplified as a film to be treated, no limitation is imposed so far as the film to be treated is a thin film on a glass substrate. Further, numeral 703 designates an infrared light lamp on a lower face side of the substrate and numeral 704 designates an ultraviolet light lamp on an upper face side of the substrate.

The feature of this embodiment resides in arranging a first infrared light auxiliary lamp 705 and a second infrared light auxiliary lamp 706 in parallel with the ultraviolet light lamp 704. Further, although according to the embodiment, the infrared light auxiliary lamps 705 and 706 are arranged at the front side and the rear side of the ultraviolet light lamp 704 (in respect of a direction of moving the substrate), they may be arranged only on one side.

According to the above-described constitution, the respective lamps 703 through 706 are moved in a direction of arrow marks in the figure and scan linear lights. In the constitution of this embodiment, firstly, the amorphous silicon film 702 is heated by being irradiated with infrared light by the first infrared light auxiliary lamp 705. This region constitutes a preheating region 707 and is moved forwardly in accordance with movement of the substrate.

On the rear side of the preheating region 707, a main heating region 708 is constituted by being irradiated with ultraviolet light from the ultraviolet light lamp 704 from the upper face side of the substrate and irradiated with infrared light from the infrared light lamp 703 from the lower face side of the substrate. In the case of this embodiment, the amorphous silicon film 702 is crystallized in the main heating region 708.

A postheating region 709 which is heated by infrared light from the second infrared light auxiliary lamp 706 is formed on the rear side of the main heating region 708. This region is a region for heating the crystalline silicon film provided at the main heating region 708.

As described above, with regard to the amorphous silicon film 702 (which is converted into crystalline silicon film in the midway), successively arranged regions of the preheating region 707, the main heating region 708 and the postheating region 709 are forwardly moved apparently in accordance with the movement of the substrate.

Figure 7B:
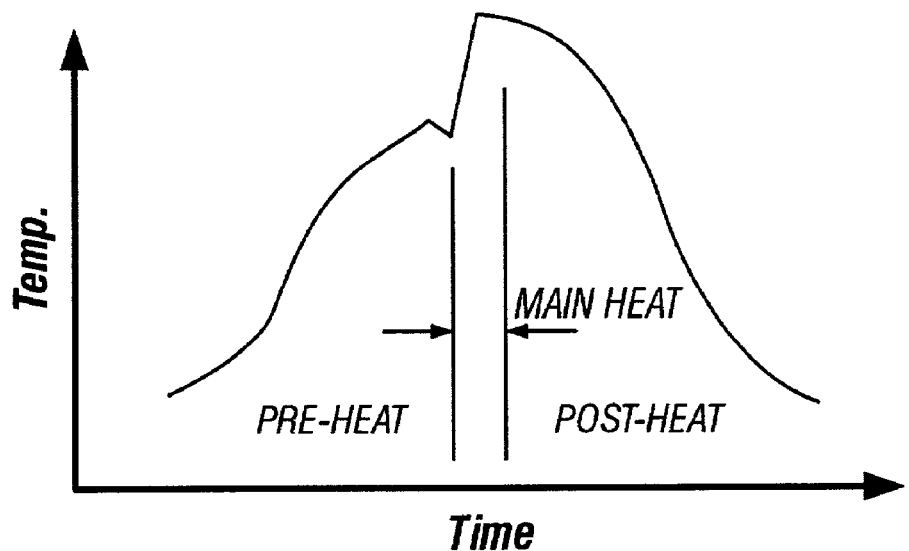

Here, FIG. 7B shows a diagram indicating a relationship between time and temperature with respect to a certain point of the amorphous silicon film 702. As shown by FIG. 7B, with elapse of time, firstly, the preheating region is constituted, successively followed by the main heating region and the postheating region.

As is apparent from FIG. 7B, temperature is elevated to a certain degree in the preheating region 707 which serves to alleviate a temperature gradient between the preheating region 707 and the next main heating region 708. This is a devise for preventing the amorphous silicon film 702 from being rapidly heated in the main heating region 708 and preventing strain energy or the like from being accumulated in the silicon film.

Accordingly, it is preferable to set output energy of the first infrared light auxiliary lamp 705 smaller than output energy of the infrared light lamp 703. In this case, an operator may pertinently determine to adjust how the temperature gradient is formed.

Next, when the point of the amorphous silicon film 702 passes through the preheating region 707, the point enters the main heating region 708 where the film face temperature is elevated to 600 through 1200° C. when the point is irradiated with infrared light from the lower face side of the substrate. In this region, the amorphous silicon film 702 is converted into a crystalline silicon film. Further, the ultraviolet light irradiated simultaneously does not produce thermal change since it contributes to electron excitation.

The crystalline silicon film provided in the main heating region 708 is heated by the second infrared light auxiliary lamp 706 arranged on the rear side of the ultraviolet light lamp 704. The postheating region 709 serves to prevent crystallization from being finished in a state where thermal equilibrium is deteriorated by rapid cooling in the main heating region 708. This is a devise for providing the most stable bond state by providing allowance in a time period required for crystallization.

Accordingly, it is preferable that output energy of the second infrared light auxiliary lamp 706 is also set smaller than that of the infrared light lamp 703 arranged on the lower face of the substrate and is adjusted to form a temperature gradient where temperature drops gradually.

By the above-described constitution, stress and strain which can be caused by rapidly heating the amorphous silicon film and rapidly cooling of the crystalline silicon film and occurrence of crystal defects such as unpaired bonds and the like are restrained and a crystalline silicon film excellent in the crystalline performance can be obtained.

(Embodiment 7)

In this embodiment, an explanation will be given of an outline of a constitution of a heating treatment device necessary for carrying out the present invention. Incidentally, the most significant feature of the present invention resides in carrying out a heating treatment by simultaneously irradiating ultraviolet light and infrared light and a device constitution capable of carrying out such a heating treatment is not limited to this embodiment.

Figure 8A:
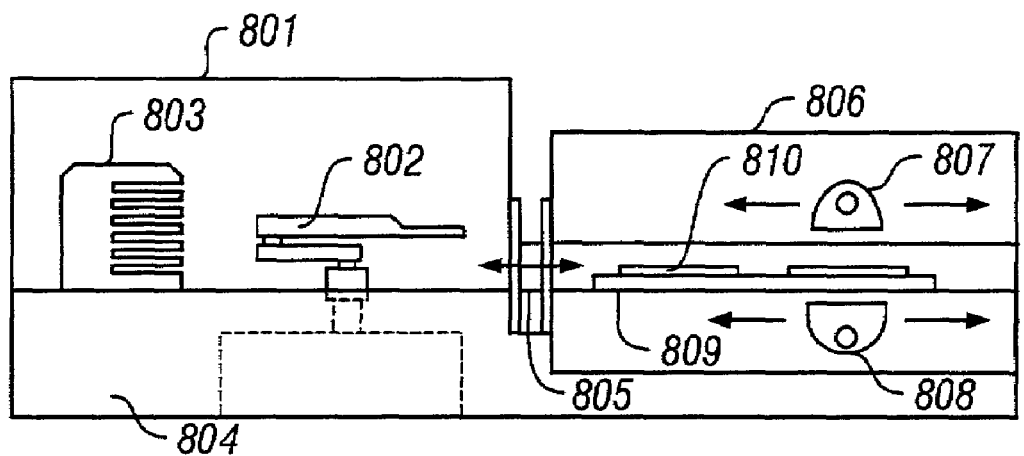
FIGS. 8A and 8B are views showing a heating treatment device used in the present invention.

FIG. 8A shows a simplified view in view of a heating treatment device necessary for carrying out Embodiment 1 through Embodiment 5 from a transverse direction. Further, FIG. 8B shows a view in view of the heating treatment device from an upper face.

In FIG. 8A, a substrate transfer unit (including arm and control circuit) 802, a cassette 803 for storing substrates to be treated and a susceptor transfer unit 804 are arranged in a load/lock chamber 801. Further, a processing chamber 806 is connected to the load/lock chamber 801 via a gate valve 805.

A light source of ultraviolet light (including ultraviolet light lamp, reflecting mirror, cylindrical lens and the like) 807 and a light source of infrared light (including infrared light lamp, reflecting mirror, cylindrical lens and the like) 808 are arranged in the processing chamber 806 to interpose a susceptor 809 and substrates to be treated 810. Further, the longitudinal direction is in a direction orthogonal to paper face.

Figure 8B:
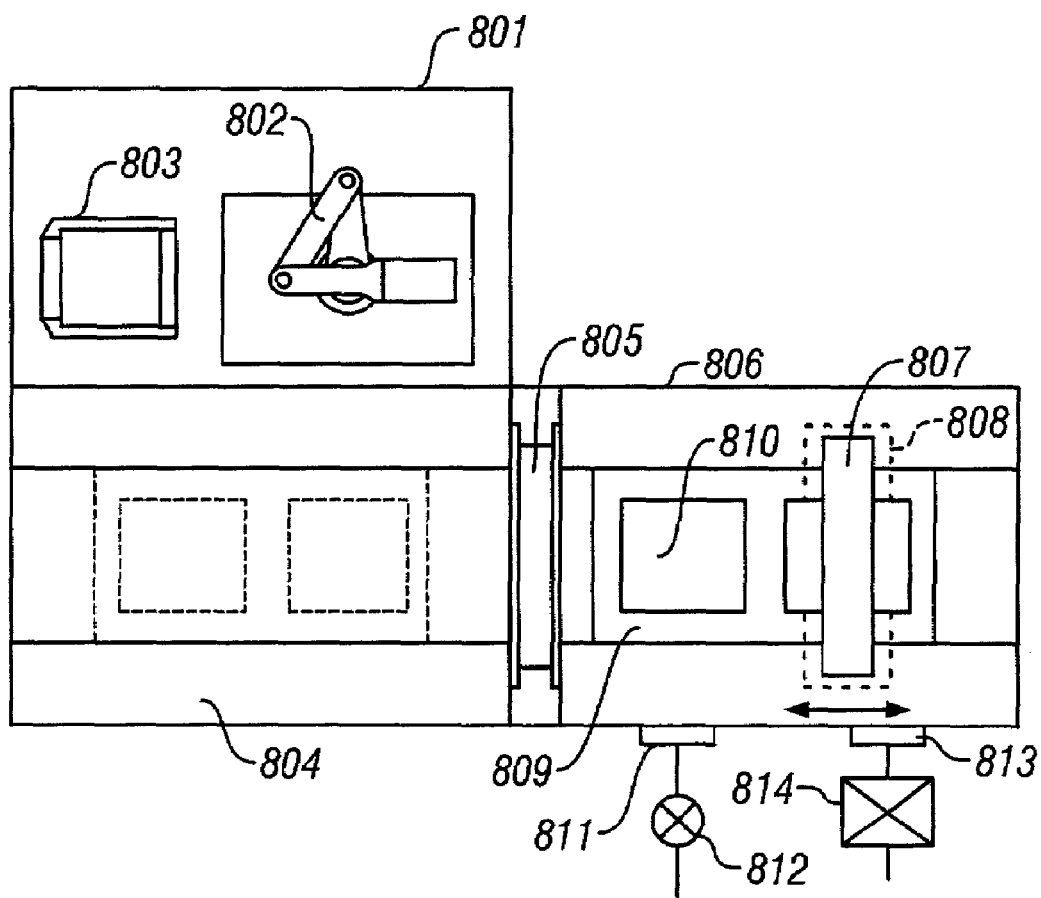

Further, as shown by FIG. 8B, atmosphere gas is supplied from an introducing port 811 into the processing chamber 806. In that case, the flow rate is adjusted by a valve 812. Incidentally, although atmosphere gas differs depending on processes, a gas which does not form a solid substance by irradiating ultraviolet light is preferable.

Further, the atmosphere gas introduced into the processing chamber 806 is exhausted from an exhaust port 813. In that case, it is preferable to install an exhaust pump 814 as necessary. When it is not necessary to use a vacuum pump, a facility of an exhaust scrubber or the like is sufficient.

According to the device as described above, firstly, the substrate to be treated 810 is transferred from the cassette 803 by the substrate transfer unit 802. Then, the substrate to be treated 810 is placed on the susceptor 809 on the susceptor transfer unit 804 and is transferred to the processing chamber 806 along with the susceptor.

In the processing chamber 806, the light source of ultraviolet light 807 and the light source of infrared light 808 both emitting linear light are moved from one end to other end of the substrate to be treated 810 and a heating treatment is carried out by the linear light. In that case, regions of irradiating ultraviolet light and infrared light may overlap completely or may be shifted from each other in the forward and rearward direction.

When the heating treatment has been finished, the susceptor 809 is returned to the load/lock chamber 801 by the susceptor transfer unit 804 and the treated substrate 810 is stored to the cassette 803 by the substrate transfer unit 802. The sheet by sheet heating treatment is carried out by repeating a series of motions as mentioned above.

Incidentally, this embodiment is an embodiment of a device necessary for carrying out the present invention and the structure and the like are not limited thereto. For example, a constitution where scanning of linear light is carried out by fixing light sources of linear light and moving a substrate is possible.

(Embodiment 8)

In this embodiment, an explanation will be given of an example of a case where a heating treatment device having a constitution different from that of Embodiment 7 is used. The explanation will be given in reference to FIGS. 9A and 9B.

Figure 9A:
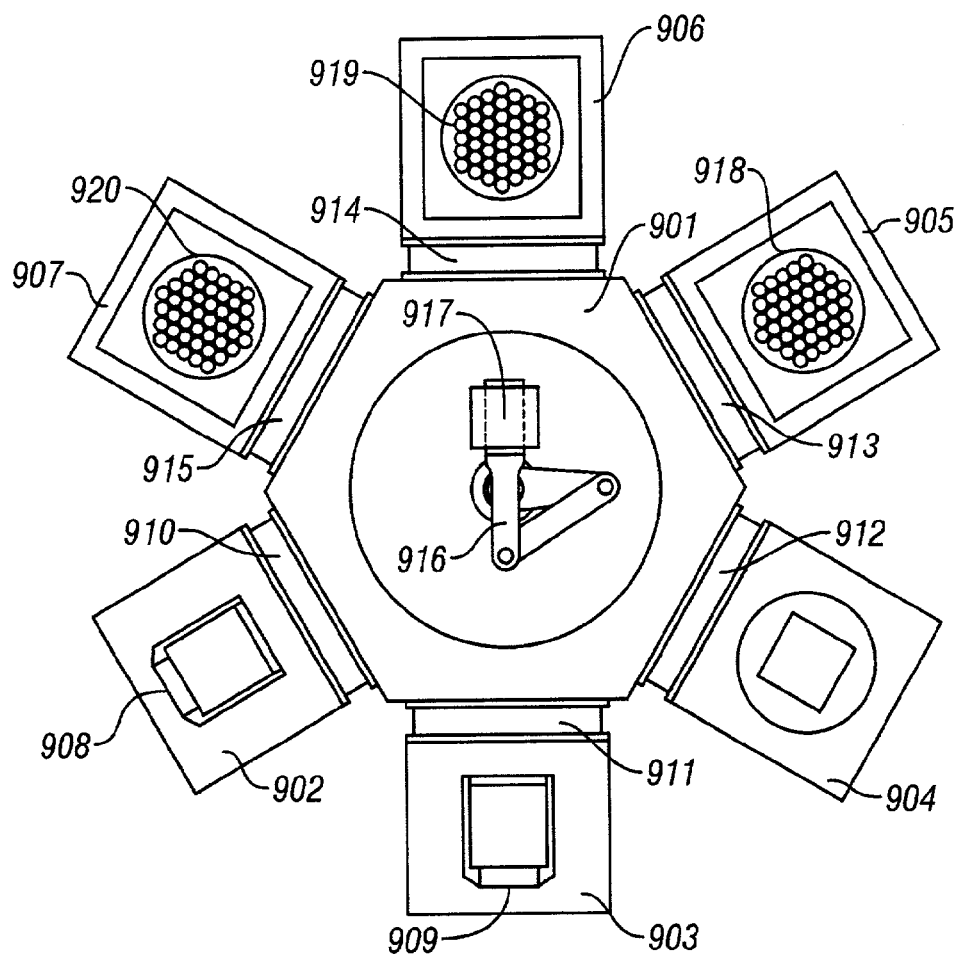
FIGS. 9A and 9B are views showing a heating treatment device used in the present invention.

FIG. 9A shows a sheet by sheet type heating treatment device of a multiple chamber system (cluster tool system). A main frame 901 is connected with load/lock chambers 902 and 903, a preheating chamber (or postheating chamber) 904 and heating furnaces 905 through 907. Cassettes 908 and 909 for storing substrates are installed in the load/lock chambers 902 and 903.

Further, gate valves 910 through 915 are installed respectively between the main frame 901 and the respective chambers by which each of the chambers can maintain a state where it is hermetically sealed from the main frame 901. A vacuum exhaust pump (not illustrated) in correspondence with high vacuum is installed in each of the chambers and each of the chambers is prevented from being brought into contact with the atmosphere.

First, a substrate 917 is transferred from the load/lock chamber 902 by a transfer unit 916 installed in the main frame 901. Then, the substrate 917 is heated to some degree at the preheating chamber 904 and thereafter, transferred to any of heating furnaces 905 through 907. Incidentally, the preheating chamber 904 may be omitted.

Figure 9B:
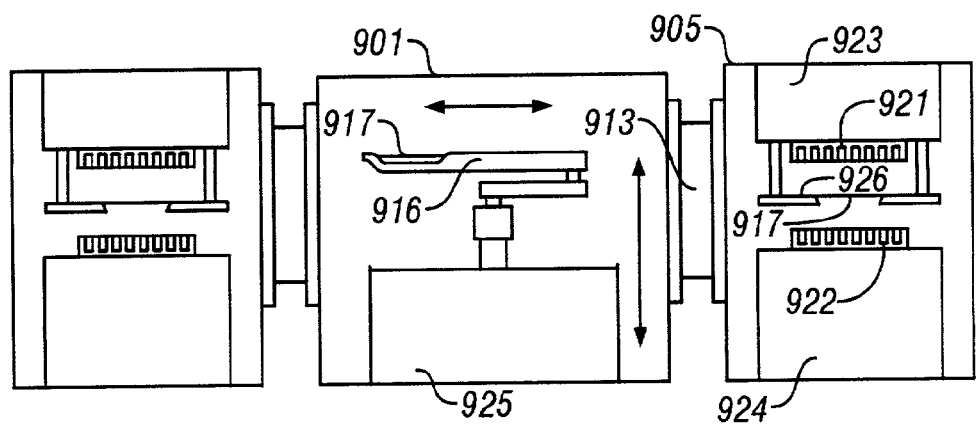

Light sources 918 through 920 each having a magnitude capable of heating the substrate 917 in one motion are installed at insides of the heating furnaces 905 through 907. Incidentally, although a single light source seems to be installed in a single chamber according to FIG. 9A, actually, as shown by FIG. 9B, a light source 921 emitting ultraviolet light and a light source 922 emitting infrared light are installed in one of the heating furnaces.

Further, when the heating treatment has been finished in any of the heating furnaces 905 through 907, the substrate 917 is transferred out again by the transfer unit 916 and is transferred into the load/lock chamber 903. Naturally, a constitution of treating the substrate in a postheating step may be installed.

Here, attention is paid to the heating furnace 905 and a simple explanation will be given of an inner structure thereof in reference to FIG. 9B. A control unit 923 for carrying out output adjustment, feedback of temperature information and the like of the light source of ultraviolet light 921 and a control unit 924 for carrying out output adjustment, feedback of temperature information and the like of the light source of infrared light 922, are arranged at each of the insides of the heating furnaces 905 through 907.

Further, the transfer in and out of the substrate to and from the heating furnace 905 is carried out by the transfer unit 916 installed to the main frame 901. The transfer unit 916 is controlled by a transfer control unit 925 and the unit can transfer the substrate 917 freely in directions of arrow marks.

Further, a susceptor 926 is attached to the control unit 923 on the upper side in the heating furnace 905 and the substrate 917 is supported with a main surface (side on which TFT is fabricated) directed toward the side of the light source of ultraviolet light 921.

The effect of the present invention can be achieved by irradiating ultraviolet light and infrared light under the state. Further, according to the embodiment, the light irradiation is carried out in one motion by using the light sources each installed with a plurality of infrared light lamps or ultraviolet light lamps and accordingly, there is not provided an advantage in a case where the linear light is used as shown by Embodiment 1. However, a glass substrate can be prevented from being warped or contracted by shortening the processing time period.

(Embodiment 9)

In this embodiment, electronic devices (applied products) each mounted with a thin film transistor or a semiconductor circuit described in Embodiments 1 through 5 are illustrated by FIGS. 10A, 10B, 10C, 10D, 10E and 10F. Incidentally, an electronic device is defined as a product mounted with a semiconductor circuit and/or an electrooptical device.

As electronic devices to which the present invention can be applied, a video camera, an electronic still camera, a projector, a head mount display, a car navigation system, a personal computer, a portable information terminal (mobile computer, portable telephone, PHS or the like) and the like are pointed out.

FIG. 10(A) designates a mobile computer which is constituted by a main body 2001, a camera unit 2002, an image receiving unit 2003, an operation switch 2004 and a display device 2005. The present invention is applicable to the camera unit 2002, the image receiving unit 2003, the display unit 2005 and the like.

FIG. 10B shows a head mount display which is constituted by a main body 2101, a display device 2102 and a band unit 2103. The present invention is applicable to the display device 2102.

FIG. 10C designates a portable telephone which is constituted by a main body 2201, a voice outputting unit 2202, a voice inputting unit 2203, a display device 2204, operation switches 2205 and an antenna 2206. The present invention is applicable to the voice outputting unit 2202, the voice inputting unit 2203, the display device 2204 and the like.

FIG. 10D designates a video camera which is constituted by a main body 2301, a display device 2302, a voice inputting unit 2303, operation switches 2304, a battery 2305 and an image receiving unit 2306. The present invention is applicable to the display device 2302, the voice inputting unit 2303, the image receiving unit 2306 and the like.

FIG. 10E shows a rear type projector which is constituted by a main body 2401, a light source 2402, a display device 2403, a polarized beam splitter 2404, reflectors 2404 and 2405 and a screen 2406. The present invention is applicable to the display device 2403.

FIG. 10F shows a front type projector which is constituted by a main body 2501, a light source 2502, a display device 2503, an optical system 2504 and a screen 2505. The present invention is applicable to the display device 2503.

As mentioned above, the range of applying the present invention is extremely wide and the present invention is applicable to all fields of electronic devices. Further, the present invention is applicable to all the products necessitating electrooptical devices or semiconductor circuits.

Incidentally, although an active matrix type of a liquid crystal panel is used in the present invention, other liquid crystal panels of different kinds can also be used.

As described above, according to the present invention, by simultaneously irradiating infrared light and ultraviolet light, the efficiency of exciting a film to be treated can further be promoted. That is, the efficiency of a heating treatment can significantly be promoted.

Particularly, when the present invention is applied to a step of improving crystalline performance of crystals whose major component is silicon, a crystalline silicon film excellent in the crystalline performance can be provided.

Further, it is one of the present invention to carry out furnace annealing after the above-described lamp annealing and by the treatment, a crystalline silicon film having little strain energy can be provided.

Further, a semiconductor device having excellent electric properties can be fabricated by using a crystalline silicon film formed in this way.

Further, when the present invention is applied to the case of activating a source region and a drain region where impurities providing N-type or P-type are added to activation layers, the impurities can be activated effectively and efficiently.

Further, by irradiating linear ultraviolet light and infrared light, a heating treatment at a temperature as high as 600 through 1200° C. can be carried out without warping or contracting the glass substrate.

What is claimed is:

1. A method of forming a semiconductor device comprising:
   forming a film comprising a material selected from the group consisting of silicon and compound containing silicon over a substrate;
   first irradiating said film with an infrared light from a lower face side of the substrate wherein the infrared light is emitted from a first light source;
   second irradiating said film with a linear ultraviolet or visible light from an upper side of the substrate wherein the linear ultraviolet or visible light is emitted from a second light source; and moving said substrate or moving said first and second light sources during said first irradiating and said second irradiating to crystallize said film or to improve crystallinity of said film; and forming a gate electrode with a gate insulating film interposed therebetween after first irradiating and second irradiating, wherein said first light source comprises a linear lamp; and wherein said second light source comprises a lamp.

2. The method of claim 1 wherein said film contains therein an impurity providing one conductivity to said film, and said impurity is activated by said first irradiating and said second irradiating.

3. The method of claim 1 wherein said film comprises $Si_xGe_{1-x}$ (0<x<1).

4. The method of claim 1 wherein said film comprises a source region, a drain region, and a channel formation region provided between said source region and said drain region in a transistor.

5. The method of claim 1 wherein said first light source is provided under and in parallel with said substrate, and said second light source is provided over and in parallel with said substrate.

6. The method of claim 1 wherein said film has a thickness of 10 to 75 nm.

7. The method of claim 1, wherein a longitudinal direction of said linear lamp is parallel with the substrate.

8. The method of claim 1, wherein the range of the first irradiation is wider then a range of second irradiation.

9. The method of claim 1, wherein a length of the light emitted from the first light source in a direction of a short side is longer than a length of the light emitted from the second light source in a direction of the short side.

10. The method of claim 1 further comprising the step of third irradiating said film with a infrared light from an upper side of the substrate wherein the infrared light is emitted from a third light source, wherein said third light source comprises an auxiliary lamp.

11. A method of forming a semiconductor device comprising:

forming a film comprising a material selected from the group consisting of silicon and compound containing silicon over a substrate;

first irradiating said film with a light from a lower face side of the substrate wherein the light is emitted from a first light source and has a wavelength region capable of subjecting bonds of atoms constituting said film to a vibrational excitation;

second irradiating said film with a linear ultraviolet or visible light from an upper side of the substrate wherein the linear ultraviolet or visible light is emitted from a second light source moving said substrate or moving said first and second light sources during said first irradiating and said second irradiating to crystallize said film or to improve crystallinity of said film; and forming a gate electrode with a gate insulating film interposed therebetween after first irradiating and second irradiating, wherein said first light source comprises a linear lamp; and wherein said second light source comprises a lamp.

12. The method of claim 11 wherein said film contains therein an impurity providing one conductivity to said film, and said impurity is activated by said first irradiating and said second irradiating.

13. The method of claim 11 wherein said film comprises $Si_xGe_{1-x}$ (0<x<1).

14. The method of claim 11 wherein said film comprises a source region, a drain region, and a channel formation region provided between said source region and said drain region in a transistor.

15. The method of claim 11 wherein said first light source is provided under and in parallel with said substrate, and said second light source is provided over and in parallel with said substrate.

16. The method of claim 11 wherein said film has a thickness of 10 to 75 nm.

17. The method of claim 11, wherein a longitudinal direction of said linear lamp is parallel with the substrate.

18. The method of claim 11, wherein a range of the first irradiation is wider than a range of a second irradiation.

19. The method of claim 11, wherein a length of the light emitted from the first light source in a direction of a short side is longer than a length of the light emitted from the second light source in a direction of the short side.

20. The method of claim 11 further comprising the step of third irradiating said film with a infrared light from an upper side of the substrate wherein the infrared light is emitted from a third light source, wherein said third light source comprises an auxiliary lamp.

21. A method of forming a semiconductor device comprising:

forming a film comprising a material selected from the group consisting of silicon and compound containing silicon over a substrate;

first irradiating said film with a light from a lower face side of the substrate wherein the light is emitted from a first light source and has a wavelength of 500 nm to 20 µm;

second irradiating said film with a linear ultraviolet or visible light from an upper side of the substrate wherein the linear ultraviolet or visible light is emitted from a second light source moving said substrate or moving said first and second light sources during said first irradiating and said second irradiating to crystallize said film or to improve crystallinity of said film; and forming a gate electrode with a gate insulating film interposed therebetween after first irradiating and second irradiating, wherein said first light source comprises a linear lamp; and wherein said second light source comprises a lamp.

22. The method of claim 21 wherein said film contains therein an impurity providing one conductivity to said film, and said impurity is activated by said first irradiating and said second irradiating.

23. The method of claim 21 wherein said film comprises $Si_xGe_{1-x}$ (0<x<1).

24. The method of claim 21 wherein said film comprises a source region, a drain region, and a channel formation region provided between said source region and said drain region in a transistor.

25. The method of claim 21 wherein said first light source is provided under and in parallel with said substrate, and said second light source is provided over and in parallel with said substrate.

26. The method of claim 21 wherein said film has a thickness of 10 to 75 nm.

27. The method of claim 21 wherein a longitudinal direction of said linear lamp is parallel with the substrate.

28. The method of claim 21, wherein a range of the first irradiation is wider than a range of a second irradiation.

29. The method of claim 21, wherein a length of the light emitted from the first light source in a direction of a short side is longer than a length of the light emitted from the second light source in a direction of the short side.

30. The method of claim 21 further comprising the step of third irradiating said film with a infrared light from an upper side of the substrate wherein the infrared light is emitted from a third light source,
wherein said third light source comprises an auxiliary lamp.

31. A method of forming a semiconductor device comprising:
forming a film comprising a material selected from the group consisting of silicon and compound containing silicon over a substrate;
first irradiating said film with an infrared light from a lower face side of the substrate wherein the infrared light is emitted from a first light source;
second irradiating said film with a linear light from an upper side of the substrate wherein the linear light is emitted from a second light source and has a wavelength region capable of subjecting bonds of atoms constituting said film to an electron excitation; and
moving said substrate or moving said first and second light sources during said first irradiating and said second irradiating to crystallize said film or to improve crystallinity of said film; and
forming a gate electrode with a gate insulating film interposed therebetween after first irradiating and second irradiating,
wherein said first light source comprises a linear lamp; and
wherein said second light source comprises a lamp.

32. The method of claim 31 wherein said film contains therein an impurity providing one conductivity to said film, and said impurity is activated by said first irradiating and said second irradiating.

33. The method of claim 31 wherein said film comprises $Si_xGe_{1-x}$ (O<x<1).

34. The method of claim 31 wherein said film comprises a source region, a drain region, and a channel formation region provided between said source region and said drain region in a transistor.

35. The method of claim 31 wherein said first light source is provided under and in parallel with said substrate, and said second light source is provided over and in parallel with said substrate.

36. The method of claim 31 wherein said film has a thickness of 10 to 75 nm.

37. The method of claim 31, wherein a longitudinal direction of said linear lamp is parallel with the substrate.

38. The method of claim 31, wherein a range of the first irradiation is wider than a range of a second irradiation.

39. The method of claim 31, wherein a length of the light emitted from the first light source in a direction of a short side is longer than a length of the light emitted from the second light source in a direction of the short side.

40. The method of claim 31 further comprising the step of third irradiating said film with a infrared light from an upper side of the substrate wherein the infrared light is emitted from a third light source,
wherein said third light source comprises an auxiliary lamp.

41. A method of forming a semiconductor device comprising:
forming a film comprising a material selected from the group consisting of silicon and compound containing silicon over a substrate;
first irradiating said film with a light from a lower face side of the substrate wherein the light is emitted from a first light source and has a wavelength region capable of subjecting bonds of atoms constituting said film to a vibrational excitation;
second irradiating said film with a linear light from an upper side of the substrate wherein the linear light is emitted from a second light source and has a wavelength region capable of subjecting bonds of atoms constituting said film to an electron excitation;
moving said substrate or moving said first and second light sources during said first irradiating and said second irradiating to crystallize said film or to improve crystallinity of said film; and
forming a gate electrode with a gate insulating film interposed therebetween after first irradiating and second irradiating,
wherein said first light source comprises a linear lamp; and
wherein said second light source comprises a lamp.

42. The method of claim 41 wherein said film contains therein an impurity providing one conductivity to said film, and said impurity is activated by said first irradiating and said second irradiating.

43. The method of claim 41 wherein said film comprises $Si_xGe_{1-x}$ (0<x<1).

44. The method of claim 41 wherein said film comprises a source region, a drain region, and a channel formation region provided between said source region and said drain region in a transistor.

45. The method of claim 41 wherein said first light source is provided under and in parallel with said substrate, and said second light source is provided over and in parallel with said substrate.

46. The method of claim 41 wherein said film has a thickness of 10 to 75 nm.

47. The method of claim 41, wherein a longitudinal direction of said linear lamp is parallel with the substrate.

48. The method of claim 41, wherein a range of the first irradiation is wider than a range of a second irradiation.

49. The method of claim 41, wherein a length of the light emitted from the first light source in a direction of a short side is longer than a length of the light emitted from the second light source in a direction of the short side.

50. The method of claim 41 further comprising the step of third irradiating said film with a infrared light from an upper side of the substrate wherein the infrared light is emitted from a third light source,
wherein said third light source comprises an auxiliary lamp.

51. A method of forming a semiconductor device comprising:
forming a film comprising a material selected from the group consisting of silicon and compound containing silicon over a substrate;
first irradiating said film with a light from a lower face side of the substrate wherein the light is emitted from a first light source and has a wavelength of 500 nm to 20 µm;

second irradiating said film with a linear light from an upper side of the substrate wherein the linear light is emitted from a second light source and has a wavelength region capable of subjecting bonds of atoms constituting said film to an electron excitation;

moving said substrate or moving said first and second light sources during said first irradiating and said second irradiating to crystallize said film or to improve crystallinity of said film; and forming a gate electrode with a gate insulating film interposed therebetween after first irradiating and second irradiating, wherein said first light source comprises a linear lamp; and wherein said second light source comprises a lamp.

52. The method of claim 51 wherein said film contains therein an impurity providing one conductivity to said film, and said impurity is activated by said first irradiating and said second irradiating.

53. The method of claim 51 wherein said film comprises $Si_xGe_{1-x}$ (0<x<1).

54. The method of claim 51 wherein said film comprises a source region, a drain region, and a channel formation region provided between said source region and said drain region in a transistor.

55. The method of claim 51 wherein said first light source is provided under and in parallel with said substrate, and said second light source is provided over and in parallel with said substrate.

56. The method of claim 51 wherein said film has a thickness of 10 to 75 nm.

57. The method of claim 51, wherein a longitudinal direction of said linear lamp is parallel with the substrate.

58. The method of claim 51, wherein a range of the first irradiation is wider than a range of a second irradiation.

59. The method of claim 51, wherein a length of the light emitted from the first light source in a direction of a short side is longer than a length of the light emitted from the second light source in a direction of the short side.

60. The method of claim 51 further comprising the step of third irradiating said film with a infrared light from an upper side of the substrate wherein the infrared light is emitted from a third light source, wherein said third light source comprises an auxiliary lamp.

61. A method of forming a semiconductor device comprising:

forming a film comprising a material selected from the group consisting of silicon and compound containing silicon over a substrate;

first irradiating said film with an infrared light from a lower face side of the substrate wherein the infrared light is emitted from a first light source;

second irradiating said film with a linear light from an upper side of the substrate wherein the linear light is emitted from a second light source and has a wavelength of 10 to 600 nm;

moving said substrate or moving said first and second light sources during said first irradiating and said second irradiating to crystallize said film or to improve crystallinity of said film; and forming a gate electrode with a gate insulating film interposed therebetween after first irradiating and second irradiating, wherein said first light source comprises a linear lamp; and wherein said second light source comprises a lamp.

62. The method of claim 61 wherein said film contains therein an impurity providing one conductivity to said film, and said impurity is activated by said first irradiating and said second irradiating.

63. The method of claim 61 wherein said film comprises $Si_xGe_{1-x}$ (0<x<1).

64. The method of claim 61 wherein said film comprises a source region, a drain region, and a channel formation region provided between said source region and said drain region in a transistor.

65. The method of claim 61 wherein said first light source is provided under and in parallel with said substrate, and said second light source is provided over and in parallel with said substrate.

66. The method of claim 61 wherein said film has a thickness of 10 to 75 nm.

67. The method of claim 61, wherein a longitudinal direction of said linear lamp is parallel with the substrate.

68. The method of claim 61, wherein a range of the first irradiation is wider than a range of a second irradiation.

69. The method of claim 61, wherein a length of the light emitted from the first light source in a direction of a short side is longer than a length of the light emitted from the second light source in a direction of the short side.

70. The method of claim 61 further comprising the step of third irradiating said film with a infrared light from an upper side of the substrate wherein the infrared light is emitted from a third light source, wherein said third light source comprises an auxiliary lamp.

71. A method of forming a semiconductor device comprising:

forming a film comprising a material selected from the group consisting of silicon and compound containing silicon over a substrate;

first irradiating said film with a light from a lower face side of the substrate wherein the light is emitted from a first light source and has a wavelength region capable of subjecting bonds of atoms constituting said film to a vibrational excitation;

second irradiating said film with a linear light from an upper side of the substrate wherein the linear light is emitted from a second light source and has a wavelength of 10 to 600 nm;

moving said substrate or moving said first and second light sources during said first irradiating and said second irradiating to crystallize said film or to improve crystallinity of said film; and forming a gate electrode with a gate insulating film interposed therebetween after first irradiating and second irradiating, wherein said first light source comprises a linear lamp; and wherein said second light source comprises a lamp.

72. The method of claim 71 wherein said film contains therein an impurity providing one conductivity to said film, and said impurity is activated by said irradiating and said second irradiating.

73. The method of claim 71 wherein said film comprises $Si_xGe_{1-x}$ (0<x<1).

74. The method of claim 71 wherein said film comprises a source region, a drain region, and a channel formation region provided between said source region and said drain region in a transistor.

75. The method of claim 71 wherein said first light source is provided under and in parallel with said substrate, and said second light source is provided over and in parallel with said substrate.

76. The method of claim 71 wherein said film has a thickness of 10 to 75 nm.

77. The method of claim 71, wherein a longitudinal direction of said linear lamp is parallel with the substrate.

78. The method of claim 71, wherein a range of the first irradiation is wider than a range of a second irradiation.

79. The method of claim 71, wherein a length of the light emitted from the first light source in a direction of a short side is longer than a length of the light emitted from the second light source in a direction of the short side.

80. The method of claim 71 further comprising the step of third irradiating said film with a infrared light from an upper side of the substrate wherein the infrared light is emitted from a third light source,
wherein said third light source comprises an auxiliary lamp.

81. A method of forming a semiconductor device comprising:
forming a film comprising a material selected from the group consisting of silicon and compound containing silicon over a substrate;
first irradiating said film with a light from a lower face side of the substrate wherein the light is emitted from a first light source and has a wavelength of 500 nm to 20 μm;
second irradiating said film with a linear light from an upper side of the substrate wherein the linear light is emitted from a second light source and has a wavelength of 10 to 600 nm; and
moving said substrate or moving said first and second light sources during said first irradiating and said second irradiating to crystallize said film or to improve crystallinity of said film; and
forming a gate electrode with a gate insulating film interposed therebetween after first irradiating and second irradiating,
wherein said first light source comprises a linear lamp; and
wherein said second light source comprises a lamp.

82. The method of claim 81 wherein said film contains therein an impurity providing one conductivity to said film, and said impurity is activated by said first irradiating and said second irradiating.

83. The method of claim 81 wherein said film comprises $Si_xGe_{1-x}$ (0<x<1).

84. The method of claim 81 wherein said film comprises a source region, a drain region, and a channel formation region provided between said source region and said drain region in a transistor.

85. The method of claim 81 wherein said first light source is provided under and in parallel with said substrate, and said second light source is provided over and in parallel with said substrate.

86. The method of claim 81 wherein said film has a thickness of 10 to 75 nm.

87. The method of claim 81, wherein a longitudinal direction of said linear lamp is parallel with the substrate.

88. The method of claim 81, wherein a range of the first irradiation is wider than a range of a second irradiation.

89. The method of claim 81, wherein a length of the light emitted from the first light source in a direction of a short side is longer than a length of the light emitted from the second light source in a direction of the short side.

90. The method of claim 81 further comprising the step of third irradiating said film with a infrared light from an upper side of the substrate wherein the infrared light is emitted from a third light source,
wherein said third light source comprises an auxiliary lamp.

* * * * *